United States Patent
Ho et al.

(10) Patent No.: US 7,135,523 B2
(45) Date of Patent: Nov. 14, 2006

(54) NANOSCALE HELICAL MICROSTRUCTURES AND CHANNELS FROM CHIRAL POLY(L-LACTIDE) BLOCK CONTAINING BLOCK COPOLYMERS

(75) Inventors: Rong-Ming Ho, Hsinchu (TW); Yeo-Wan Chiang, Taichung (TW); Chu-Chieh Lin, Taichung (TW); Bao-Tsan Ko, Taichung (TW); Yi-Chun Chen, Hsinchu (TW); Tsai-Ming Chung, Hsinchu (TW); Hsi-Hsin Shih, Hsinchu (TW); Jassy S. J. Wang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/799,845

(22) Filed: Mar. 12, 2004

(65) Prior Publication Data

US 2006/0211816 A1    Sep. 21, 2006

Related U.S. Application Data

(60) Provisional application No. 60/454,764, filed on Mar. 14, 2003, provisional application No. 60/467,022, filed on Apr. 30, 2003, provisional application No. 60/472,377, filed on May 20, 2003.

(51) Int. Cl.
*C08G 63/08* (2006.01)

(52) U.S. Cl. .................................. 525/55; 525/415

(58) Field of Classification Search .............. 525/55, 525/415
See application file for complete search history.

(56) References Cited

U.S. PATENT DOCUMENTS 6,210,717 B1 * 4/2001 Choi et al. .................. 424/501
6,517,869 B1 * 2/2003 Park et al. .................. 424/486

OTHER PUBLICATIONS

Zalusky et al., JACS, 2001, 123,p. 1519-1520.*
Spinu, Journal of Macromolecular Science A33(10), p. 1497-1530 (1996).*
Stevels et al. Macromolecular Chemistry and Physics, 196(11), p. 3687-94 (1995).*
Brizzolara et al. Journal of Computer Aided Materials design (1996) 3(1-3), p. 341-350.*
Kim et al., Polymer Preprints 1998, 39 (2), 423-424.*

* cited by examiner

Primary Examiner—Jeffrey Mullis
(74) Attorney, Agent, or Firm—W. Wayne Liauh

(57) ABSTRACT

A method for making a series of nanoscale microstructures, including helical microstructures and cylindrical microstructures. This method includes the steps of: (1) forming a chiral block copolymer containing a plurality of chiral first polymer blocks and a second polymer blocks wherein the chiral first polymer blocks have a volume fraction ranging from 20 to 49%; (2) causing a phase separation in the chiral block copolymer. In a preferred embodiment, the chiral block copolymer is poly(styrene)-poly(L-lactide) (PS-PLLA) chiral block copolymer, and the copolymerization process is a living copolymerization process which includes the following steps: (a) mixing styrene with BPO and 4-OH-TEMPO to form 4-hydroxy-TEMPO-terminated polystyrene; and (2) mixing the 4-hydroxy-TEMPO-terminated polystyrene with $[(\eta_3\text{-EDBP})Li_2]_2[(\eta_3\text{-}^nBu)Li(0.5Et_2O)]_2$ and L-lactide in an organic solvent preferably $CH_2Cl_2$ to form the poly(styrene)-poly(L-lactide) chiral block copolymer. Transmission electron microscopy (TEM) and small X-ray scattering (SAXS) studies show that when the volume fraction of poly(L-lactide) is about 35–37%, nanoscale helices with a pitch of 43.8 nanometers and a diameter of 34.4 nanometers were observed.

16 Claims, 11 Drawing Sheets

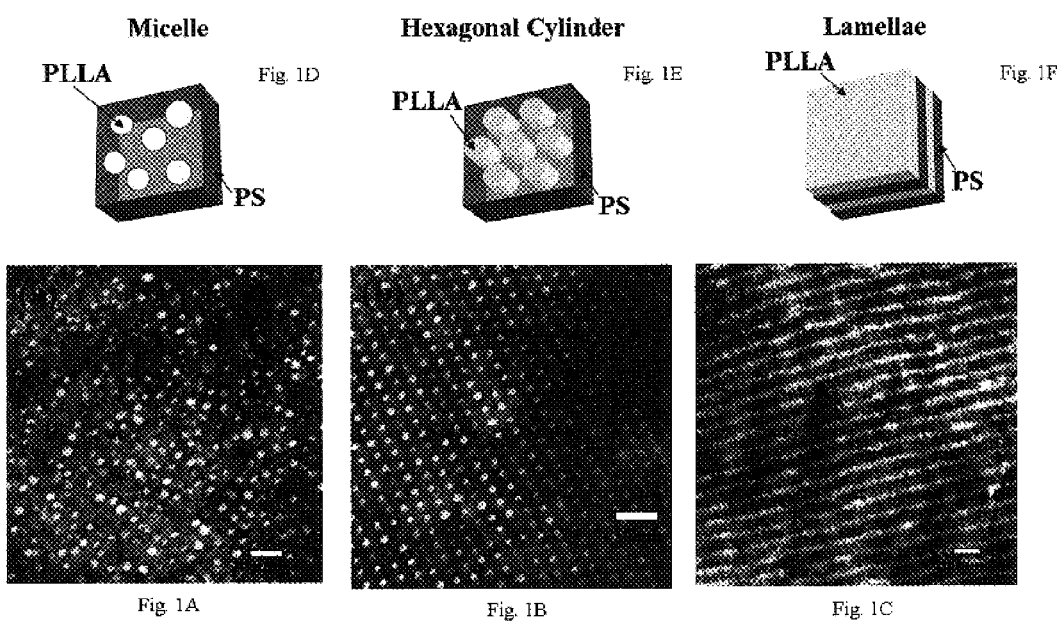

Fig. 3A
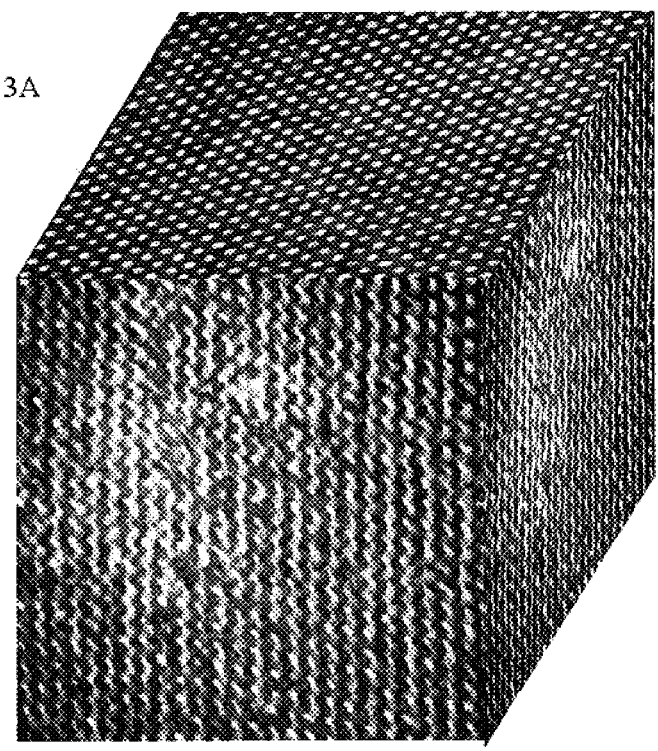
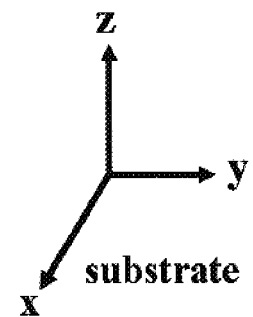

NANOSCALE HELICAL MICROSTRUCTURES AND CHANNELS FROM CHIRAL POLY(L-LACTIDE) BLOCK CONTAINING BLOCK COPOLYMERS

The present invention claims priority of provisional applications Nos. 60/454,764, filed Mar. 14, 2003; 60/467,022, filed Apr. 30, 2003; and 60/472,377, filed May 20, 2003.

FIELD OF THE INVENTION

The present invention relates to a method for preparing nanoscale helical microstructures and microchannels using chiral block copolymers, and the series of systems and articles made therefrom. More specifically, the present invention relates to a method for preparing nanoscale helical microstructures and microchannels using chiral block copolymers, and the series of systems and articles made therefrom.

BACKGROUND OF THE INVENTION

The contents therein are incorporated herein by reference.

PCT patent application No. WO 00/02090 describes an elaborate procedure for preparing polymeric articles having a three-dimensionally periodic structure of a plurality of periodically occurring separate domains, with at least a first and a second domain each being topologically continuous and with the first domain comprising a polymeric species containing an inorganic species capable of forming a ceramic oxide. It is desirable to explore other approaches that could be more cost-effective.

Self-assembly of block copolymers have received extensive attention because of their fascinating phase behavior. Some of the studies have been reported by F. S. Bates in Science, 251, 898 (1991), and F. S. Bates and G. H. Fredrickson in Phys. Today, 32 (1990). Nanoscale microstructures from microphase separation can be obtained simply by chemically joining immiscible polymer chains together as block copolymers. Thermodynamically, the formed microstructure is the lowest Gibb free energy of morphology by balancing the enthalpic penalty and the entropic driving force of mixing, expressing as $\chi N$, the product of Flory-Huggins segmental interaction parameter $\chi$ and the degree of polymerization N. One-, two-, and three-dimensional periodicities of self-assembled morphologies in bulk such as lamellar, cylindrical and gyroid microstructures have been identified with respect to various fractions of constituted blocks. These are reported in, e.g., F. S. Bates in Science, 251, 898 (1991); F. S. Bates and G. H. Fredrickson in Phys. Today, 32 (1990); S. Forster, A. K. Khandpur, J. Zhao, F. S. Bates, I. W. Hamley, A. J. Ryan, Bras W. Macromolecules 27, 6922 (1994); Vanessa Z. -H. Chan, J. Hoffman, V. Y. Lee, H. Iatrou, A. Avgeropoulos, N. Hadjichristidis, R. D. Miller, E. L. Thomas, Science 286, 1716 (1999); and F. S. Bates and G. H. Fredrickson, Annu. Rev. Phys. Chem. 41, 525 (1990). Defined textures can be easily tailored by molecular engineering of synthetic block copolymers that appears promising in the applications of nanotechnologies. Examples of these reports can be found in M. Park, C. K. Harrison, P. M. Chaikin, R. A. Register, D. H. Adamson, Science 276, 1401 (1997); D. E. Fogg, L. H. Radzilowski, R. Balnski, R. R. Schrock, E. L. Thomas, Macromolecules 30, 417 (1997); Y. N. C. Chan, R. R. Schrock, R. E. Cohen, Chem. Mater. 4, 24 (1992); S. Forster, M. Antonietti, Adv. Mater. 10, 195 (1998); B. M. Discher, H. Bermudez, D. A. Hammer, D. E. Discher, Y. -Y. Won, F. S. Bates, J. Phys. Chem. B 106, 2848 (2002); A. -V. G. Ruzette, P. P. Soo, D. R. Sadoway, A. M. Mayes, J. Electrochem. Soc. 148, A537 (2001); N. Matsumi, K. Sugai, H. Ohno, Macromolecules 35, 5731 (2002); M. A. Hillmyer, P. M. Lipic, D. A. Hajduk, K. Almdal, F. S. Bates, J. Am. Chem. Soc. 119, 2749 (1997); P. M. Lipic, F. S. Bates, M. A. Hillmyer, J. Am. Chem. Soc. 120, 8963 (1998); J. M. Dean, P. M. Lipic, R. B. Grubbs, R. F. Cook, F. S. Bates, J. Polym. Sci., Part B: Polym. Phys. 39, 2996 (2001); and M. R. Buchmeiser, Angew. Chem., Int. Ed. 40, 3795 (2001).

Nature also employs the self-assembly of compounds as a tool for structuring substances. Biological architectures are formed by the interplay among steric, hydrophobic, hydgrogen-bonding, electrostatic interactions to form different levels of organization, i.e., different length-scales of morphologies. These morphologies are built from the smallest building blocks, e.g., amino acids, to achieve higher levels of organization. The self-assembly of synthetic supramolecules since its early days has been inspired by using these secondary interactions of biological matters, and has already created a large number of nanoscale architectures. Pursuing biological-like architectures by using synthetic systems has been, and still is the essential goals of many researchers in the fields of chemistry and physics. Among them, helical morphologies of different length-scales varying from helical chain conformations, helical aggregations to helical agglomerates are the most fundamental and interesting textures in biological systems. Discussions on this subject can be found in, e.g., H. Engelkamp, S. Middlebeek, R. J. M. Nolte, Science 284, 785 (1999); A. R. A. Palmans, J. A. J. M. Vekemans, E. E. Havinga, E. W. Meijer, Angew. Chem., Int. Ed. Engl. 36, 2648 (1997); T. Tachibana, H. Kambara, J. Am. Chem. Soc. 87, 3015 (1965); R. J. H. Hafkamp, B. P. A. Kokke, I. M. Danke, H. P. M. Geurts, A. E. Rowan, M. C. Feiters, R. J. M. Nolte, Chem. Commun., 545 (1997); K. Hanabusa, M. Yamada, M. Kimura, H. Shirai, Angew. Chem., Int. Ed. Engl. 35, 1949 (1996); M. De Loos, J. van Esch, I. Stokroos, R. M. Kellog, B. M. Feringa, J. Am. Chem. Soc. 119, 12675 (1997); and J. H. Van Esch, B. L. Feringa, Angew. Chem., Int. Ed. 39, 2263 (2000). Y. Okamoto,; K. Suzuki, K. Ohta, K. Hatada, H. Yuki, J. Am. Chem. Soc. 101, 4763 (1979) discussed the dissymmetric shapes of helical textures result in specific chemical and physical characters such as molecular recognition and optically active properties. S. I. Stupp, V. LeBonheur, K. Walker, L. S. Li, K. E. Huggins, M. Keser, and A. Amstutz, Science 276, 384 (1997) discussed desirable reasons for producing helical materials have been identified in the field of materials and life sciences.

The chirality of compounds has been referred to as one of the main origins for the formation of helical textures, and used as secondary interaction to assemble chiral molecules and macromolecules into larger helical structures. These have been discussed in, e.g., A. E. Rowan, R. J. M. Nolte, Angew. Chem., Int. Ed., 37, 63 (1998); and M. C. Feiters, R. J. M. Nolte, in Advances in Supramolecular Chemistry. Vol. 6. Chiral Self-assembled Structures of Biomolecules and Synthetic Analogues; G. W. Gokel, Ed.; JAI Press Inc.: Stamford, Conn.; Vol. 6, pp 41–156. Helical superstructures with a specific handedness have been obtained from buffer solutions of amphiphilic block copolymers containing charged helical blocks. As described by Nolte and co-workers, the chiral entity of constituted block aside from solvent, amphiphilicity and electrostatic effects plays important role for the formation of helical superstructures in solution. See, e.g., 29. J. J. L. M. Cornelissen, M. Fischer, N. A. J. M. Sommerdijk, R. J. M. Nolte, Science 280, 1427

(1998); N. A. M. M. Sommerdijk, S. J. Holder, R. C. Hiorns, R. G. Jones, R. J. M. Nolte, *Macromolecules* 33, 8289 (2000). Hillmyer and co-workers studied poly(styrene)-poly (D,L-lactide) (PS-PLA) and no helical morphologies were found. See, A. S. Zalusky, R. Olayo-Valles, C. J. Taylor, M. A. Hillmyer, *J. Am. Chem. Soc.* 123, 1519 (2001); and A. S. Zalusky, R. Olayo-Valles, J. H. Wolf, M. A. Hillmyer, *J. Am. Chem. Soc.* 124, 1276 (2002). It is well known that aliphatic polyesters such as poly(caprolactone) (PCL) and poly(lactide) (PLA) can be hydrolytically degraded owing to the unstable character of ester group. See, J. L. Kathleen, M. Edith, *Biomaterials* 19, 1973 (1998); A. Göpferich, *Biomaterials* 17, 103 (1996); and W. K. Lee, J. A. Gardella, *Langmuir* 16, 3401 (2000).

SUMMARY OF THE INVENTION

The primary object of the present invention is to develop a method for preparing nanoscale helical microstructures and microchannels. More specifically, the primary object of the present invention is to develop a method that uses chiral block copolymers for preparing nanoscale helical microstructures and microchannels.

In the present invention, unexpected results were observed when poly(styrene)-poly(L-lactide) (PS-PLLA), chiral block copolymers containing left-handed helical backbone of PLLA blocks, were prepared by sequential living free radical and living ring-opening polymerizations. "Living" polymeriztion for the synthesis of block copolymers means the sequential addition of monomers. Left-handed PLLA helices having nanoscale dimensions of pitch length and diameter were formed from self-assembly PS-PLLA in bulk. These PLLA helices are shaped as hexagonally packed microstructure in PS matrix. In contrast to PS-PLLA, helical textures have not been found in poly (styrene)-poly(D,L-lactide). The formation of nanoscale, helical morphology driven by the chirality of synthetic block copolymers creates new scopes for block copolymer thermodynamics and applications. In a sense, the method of the present invention mimics the biologically occurring process in nature, in that the contribution of chirality aside from usual secondary interactions plays important role in the self-assembly of synthetic supramolecules. One of the main advantages of the method of the present invention is that nanoscale channels can be obtained by the hydrolysis of the PLLA blocks. The present invention opens new opportunities for block copolymer applications in the fields of nanosciences.

In the present invention, diblock copolymers constituting only achiral and chiral blocks, poly(styrene)-poly(L-lactide ) (PS-PLLA), were synthesized in this study to examine the chirality effect on self-assembly morphologies. It was unexpected discovered that well organized, hexagonally packed PLLA nanoscale helices with a left-handed helical sense equal to that of the constituted block were formed from PS-PLLA self-assembly in bulk. To the best of our knowledge, no chiral block copolymer has yet been described that generates chiral superstructures in bulk and self assembles to three-dimensionally packed microstructures. The formation of nanoscale, helical microstructures is attributed to the chiral effect of block copolymers in addition to the van der Waals interaction and the entropy of mixing. As discussed above, one of the main advantages of the method of the present invention is that nanoscale channels can be obtained by the hydrolysis of the PLLA blocks.

A series of poly(styrene)-block-poly(L-lactide) (PS-PLLA) copolymers with different volume ratio were prepared by suing a two-step polymerization sequence. Free radical polymerization of styrene using 4-hydroxy-2,2,6,6-tetramethylpiperidine-N-oxyl, 4-Hydroxy-TEMPO (4-OH-TEMPO) as initiator in the presence of dibenzoylperoxide (BPO) resulted in a hydroxy-terminated polystyrene which further reacts with $[(\mu_3\text{-EDBP})Li_2]_2[(\mu_3\text{-}^nBu)Li(0.5Et_2O)]_2$ to form a macroinitiator. Followed by the control ring-opening polymerization of L-lactide in the presence of the macroinitiator, PS-PLLA was then prepared. Using this procedure, PS-PLLA block copolymers having different amounts of PLLA were obtained.

The self-assembly morphologies of various block copolymers were studied using transmission electron microscopy (TEM) and small-angle X-ray scattering (SAXS). Bulk samples of block copolymers were prepared by solution-casting from dichloroethane ($CH_2Cl_2$) solution (0.5 wt % of PS-PLLA) at room temperature. It has been identified that crystallization effect is significant on the morphology of crystallizable block copolymers. To eliminate the disturbance of PLLA crystallization on the so-formed morphology, cast samples were annealed at temperature above the PLLA melting point but below its order-disorder transition temperature, and then quenched in liquid nitrogen. The measurements of PS-PLLA thermal behavior were carried out by differential scanning calorimetry (DSC). The order-disorder transition temperature of PS-PLLA was above degradation temperature (~170° C.) as identified by small-angle X-ray scattering (SAXS). Amorphous PS-PLLA was obtained after the thermal treatments as evidenced by differential scanning calorimetry (DSC) and wide-angle X-ray measurements (WAXD).

After quenching from the microphase-separated melt, the thermally treated samples were then sectioned by ultra-microtome after $RuO_4$ staining. A variety of microstructures such as micelle, hexagonal cylinder, lamellae textures was identified by TEM and SAXS when $f_{PLLA}^v$=0.17, 0.30, and 0.56, respectively. A helical microstructure was observed when $f_{PLLA}^v$=0.37 as shown in the TEM micrographs. The pitch and the diameter of the nanoscale helices were determined as 43.8 nm and 34.4 nm in average, respectively. The ratio of pitch to radius of the nanoscale helices (P/r=2.5) follows the general rule of helical formation in Nature of which the P/r value must be below 6.28. Well-oriented microdomains consisting of hexagonally packed PLLA twists in PS matrix were observed for cast samples by using TEM. The occupied volume fraction of PLLA blocks was calculated as 40 vol %, this is approximately consistent with estimated value from synthetic results ($f_{PLLA}^v$=0.37). Corresponding SAXS experiments were performed to further identify the observed morphology. Well-defined scattering pattern having six-fold symmetry is evident in the two-dimensional (2D) SAXS results along the helical axis whereas two-fold symmetry is obtained along the axis normal of helices. Azimuthal integrated one-dimensional SAXS profile was further obtained from the six-fold symmetry pattern. The diffraction peaks occur at relative q* values of 1:4½:7½: 9½ and a broad diffraction peak appears at ca. 3.5 q*. These results are consistent with the hexagonally packed microstructures of which the nanoscale helices can be treated as cylindrical columns for packing due to the specific P/r value.

On the assumption of cylindrical packing, the 3.5 q* diffraction can be identified as the form factor contribution of cylinder-like morphology in accordance with projected diameter along the helical axis observed by TEM. Furthermore, the determined long period, 50.6 nm, by SAXS is consistent with observed spacing by TEM. As a result, the 3D geometrical arrangement of nanoscale helical microstructure in bulk for the self-assembly of PS-PLLA was clearly identified. Also, the helical morphology adopts a left-handed helical sense equal to that of the constituted block as observed by TEM. By contrast, the formation of nanoscale helical microstructures has not been found in PS-PLA block copolymers and PLLA homopolymer. Consequently, the appearance of the helical microstructure for PS-PLLA is attributed to the effect of chirality interacting with the immiscibility of constituted blocks and the entropy of mixing.

In addition to PS-PLLA, block copolymers of poly(4-vinylpyridine)-poly(L-lactide) (P4VP-PLLA) were also synthesized using a process similar to those discussed in previous examples. In a preferred embodiment, the volume fraction poly(L-lactide) in the poly(4-vinylpyridine)-poly(L-lactide) block copolymer was calculated to be about 23% ($f_{PLLA}^v=0.23$). As shown in the TEM micrograph in a helical microstructure was also observed.

The analyses of block copolymer thermodynamics are complicated by the chiral entities of constituted components. This will definitely be an impact to the conventional treatments of block copolymers in theory. The helical behavior is expected by the chiral sense of block copolymers. For applications, the hexagonally packed helices were treated by hydrolysis of PLLA. As observed by AFM, hexagonally packed nanohole arrays were generated on the surface of solution-casting PS-PLLA samples after hydrolysis. To further identify the texture of the hydrolyzed PS-PLLA samples, field emission scanning electron microscopy was used to observe the samples from different views. To view parallel to the helical axes, ordered nanohole arrays were observed by FESEM and the results are similar to the observations by SPM. To view perpendicular to the helical axes, traces of degradation for PLLA helical morphology can be identified. As a result, helical channels can be obtained by simply hydrolyzing the PLLA helices.

BRIEF DESCRIPTION OF THE DRAWING

The present invention will be described in detail with reference to the drawing showing the preferred embodiment of the present invention, wherein:

FIG. 1A is a TEM micrograph of PS38-PLLA10 ($f_{PLLA}^v=0.17$)

FIG. 1B is a TEM micrograph of PS38-PLLA21 ($f_{PLLA}^v=0.30$)

FIG. 1C is a TEM micrograph of PS13-PLLA22 ($f_{PLLA}^v=0.56$)

FIG. 1D is a schematic drawing illustrating the nanoscale micelle microstructgure of PS38-PLLA10 ($f_{PLLA}^v=0.17$)

FIG. 1E is a schematic drawing illustrating the nanoscale hexagonal microstructgure of PS38-PLLA21 ($f_{PLLA}^v=0.30$)

FIG. 1F is a schematic drawing illustrating the nanoscale lamellae microstructgure of PS38-PLLA22 ($f_{PLLA}^v=0.56$)

FIG. 3A is a three-dimensional TEM micrograph of a PS29-PLLA22 ($f_{PLLA}^v=0.37$) solution-cast sample sectioned along xyz planes; as shown, the xy planes are the basal plane of the cast substrate and the yz and zx planes are vertical planes with respect to the cast surface.

DETAILED DESCRIPTION OF THE PREFERRED EMBODIMENT

Figure 2A:
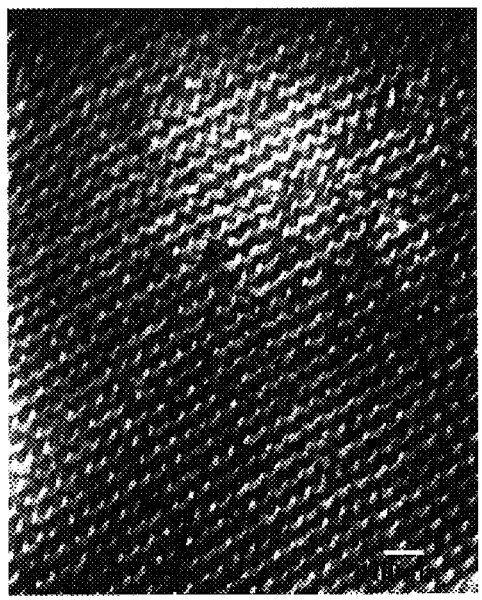
FIG. 2A is a TEM micrograph of PS29-PLLA22 ($f_{PLLA}^v=0.37$)

The present invention will now be described more specifically with reference to the following examples. It is to be noted that the following descriptions of examples, including the preferred embodiment of this invention, are presented herein for purposes of illustration and description, and are not intended to be exhaustive or to limit the invention to the precise form disclosed.

Example 1

Synthesis of 4-Hydroxy-TEMPO-terminated Polystyrene (PS-2)

A mixture of styrene (46 mL, 400 mmol), BPO (0.39 g, 1.6 mmol) and 4-OH-TEMPO (0.33 g, 1.92 mmol) (molar ratio of 4-OH-TEMPO/BPO=1.2) was preheated in a round-bottom flask (250 mL) in nitrogen atmosphere at 95° C. for 3 h to allow BPO to decompose completely. The system was then heated at 130° C. for another 4 h to yield PS-TEMPO-4-OH. The resulting polystyrene was precipitated with methanol (300 mL) from a THF (50 mL) solution.

The product was then recrystallized twice from $CH_2Cl_2$ (40 mL)/MeOH (200 mL) mixed solution, and collected by vacuum filtration to give white solids. The final solid was washed by 100 mL MeOH and dried in vacuo overnight to form PS-2 [yield: 32.6 g (78%). Mn=20900 and PDI=1.17. $^1$H NMR ($CDCl_3$): 6.46–7.09 (br, 5H, ArH), 1.84 (br, 1H, CH), 1.42 (br, 2H, $CH_2$)]. All manipulations were carried out under a dry nitrogen atmosphere. Solvents, benzoyl peroxide, styrene, L-lactide, and deuterated solvents were purified before uses.

Example 2

Synthesis of Block Copolymers of Polystyrene-Poly(L-lactide) (PS-b-PLA, or CO-4)

A typical ring-opening polymerization procedure was exemplified by the synthesis of CP-4. [($\eta_3$—EDBP)Li$_2$]$_2$ [($\eta_3$—"Bu)Li(0.5Et$_2$O)]$_2$ (0.11 g, 0.1 mmol) was added to 4-hydroxy-TEMPO-polystyrene (PS-2, 4.18 g, 0.2 mmol) in 20 mL of toluene at 0° C. The mixture was stirred at room temperature for 2 h, and then dried under vacuum. The resulting product (lithium alkoxide macroinitiator) was dissolved in CH$_2$Cl$_2$ (20 mL) and L-lactide (2.16 g, 15 mmol) in CH$_2$Cl$_2$ (10 mL) was added. While the mixture was stirred for 4 h, conversion yield (74%) of poly(L-lactide) was analyzed by $^1$H NMR spectroscopic studies.

The mixture was then quenched by the addition of an aqueous acetic acid solution (0.35 N, 20 mL) and the polymer was precipitated on pouring into n-hexane (300 mL) to give white solids. The product was purified by precipitation from CH$_2$Cl$_2$ (30 mL)/Hexane (150 mL) mixture solution. The final crystalline solid was precipitated from CH$_2$Cl$_2$ (30 mL)/MeOH (150 mL) and dried under vacuum at 50–60° C. overnight to yield 3.02 g of PS-b-PLA (CP-4) (yield: 48%). Mn=46700 and PDI=1.17. $^1$H NMR (CDCl$_3$): 6.46–7.09 (br, 5H, ArH), 5.16 (q, 1H, CH(CH$_3$), J=7.2 Hz), 1.84 (br, 1H, CH), 1.58 (d, 3H, CH(CH$_3$), J=7.2 Hz), 1.42 (br, 2H, CH$_2$). $^1$H and $^{13}$C NMR spectra were recorded on a Varian VXR-300 (300 MHz for $^1$H and 75 MHz for $^{13}$C) or a Varian Gemini-200 (200 MHz for $^1$H and 50 MHz for $^{13}$C) spectrometer with chemical shifts given in ppm from the internal TMS or the central line of CHCl$_3$. The GPC measurements were performed on a Hitachi L-7100 system equipped with a differential Bischoff8120 RI detector using THF (HPLC grade) as in eluent. Molecular weight and molecular weight distributions were calculated using polystyrene as standard.

A number of poly(styrene)-poly(L-lactide) (PS-PLLA) chiral block copolymers were prepared. On the basis of molecular weight and volume ratio, these PS-PLLAs are designated as PSxx-PLLAyy ($f_{PLLA}^v$=z), wherein xx and yy represent the molecular weight of PS and PLLA divided by one thousand measured by NMR, respectively, and z indicates the volume fraction of PLLA. In these calculations, the densities of PS and PLLA are assumed to be 1.02 and 1.18 g/cm$^3$, respectively.

Example 3

Transmission Electron Microscopy (TEM) and Small-Angle X-ray Scattering (SAXS) Studies Crystallization of PLLA in PS-PLLA gave rise to significant changes for microphase-separated morphology of PS-PLLA as observed in our laboratory. It is possible to destroy the formed microstructures so as to form crystalline morphology. DSC experiments were carried out in a Perkin Elmer DSC 7. For instance, PLLA blocks of PS29-PLLA22 ($f_{PLLA}^v$=0.37) melt at around 165° C. The maximum crystallization rate of PLLA blocks is at ca. 95° C. in accordance with exothermic response (i.e., the occurrence of crystallization) at different isothermal crystallizations. However, no significant exothermic response was observed under fast cooling. The glass transition temperatures of PLLA and PS are approximately 51.4° C. and 99.2° C., respectively.

SAXS experiments were conducted at the synchrotron X-ray beam-line X3A2 at the National Synchrotron Light Source in Brookhaven National Laboratory. The wavelength of the X-ray beam is 0.154 nm. The zero pixel of the SAXS patter was calibrated using silver behenate, with the first-order scattering vector q* (q*=4$\lambda^{-1}$ sin$\theta$, where 2$\theta$ is the scattering angle) being 1.076 nm$^{-1}$. Time-resolved SAXS experiments were carried out in a heating chamber with step temperature increasing Degradation temperature was identified by the disappearance of scattering peaks.

DSC thermogram appeared no melting endotherm during heating. WAXD (Widel-Angle X-ray Diffraction) diffraction exhibited amorphous diffraction profile. A Siemens D5000 1.2 kW tube X-ray generator (Cu K$_\alpha$ radiation) with a diffractometer was used for WAXD powder experiments. The scanning 2$\theta$ angle ranged between 5° and 40° with a step scanning of 0.05° for 3 sec. The diffraction peak positions and widths observed from WAXD experiments were carefully calibrated with silicon crystals with known crystal size.

Transmission electron microscopy in bright field was performed with JEOL TEM-1200x transmission electron microscopy. Staining was accomplished by exposing the samples to the vapor of a 4% aqueous RuO$_4$ solution for 3 hours.

The surface of the solution-casting PS-PLLA samples after hydrolysis was observed using AFM (Atomic Force Microscopy). A Seiko SPA-400 AFM with a SEIKO SPI-3800N probe station was employed at room temperature in this work. A rectangle-shaped silicon tip was applied in dynamic force mode (DFM) experiments using a type of SI-DF20 with a spring force contact of 19 Nm$^{-1}$ and scan rate of 1.0 Hz.

Field emission scanning electron microscopy was used to observe the PS-PLLA samples from different views. Field emission scanning electron microscopy (FESEM) was performed on a Hitachi S-900 FE-SEM using accelerating voltages of 2–5 keV. Samples were examined either on the solution-cast surface or fractured cross sections of PS-PLLA thin films after hydrolysis. The samples were mounted to brass shims using carbon adhesive, and then sputter-coated with 2–3 nm of gold (the gold coating thickness is estimated from a calculated deposition rate and experimental deposition time).

Example 4

Results of TEM and SAXS Studies

FIG. 1A is a TEM micrograph of PS38-PLLA10 ($f_{PLLA}^v$=0.17); FIG. 1B is a TEM micrograph of PS38-PLLA21 ($f_{PLLA}^v$=0.30); and FIG. 1C is a TEM micrograph of PS13-PLLA22 ($f_{PLLA}^v$=0.56). FIG. 1D is a schematic drawing illustrating the nanoscale micelle microstructgure of PS38-PLLA10 ($f_{PLLA}^v$=0.17); FIG. 1E is a schematic drawing illustrating the nanoscale hexagonal microstructgure of PS38-PLLA21 ($f_{PLLA}^v$=0.30); and FIG. 1F is a schematic drawing illustrating the nanoscale lamellae microstructgure of PS38-PLLA22 ($f_{PLLA}^v$=0.56).

The self-assembly morphologies of various block copolymers were studied using transmission electron microscopy (TEM) and small-angle X-ray scattering (SAXS). Bulk samples of block copolymers were prepared by solution-casting from dichloroethane (CH$_2$Cl$_2$) solution (0.5 wt % of PS-PLLA) at room temperature. It has been identified that crystallization effect is significant on the morphology of crystallizable block copolymers. To eliminate the disturbance of PLLA crystallization on the so-formed morphology, cast samples were annealed at temperature above the PLLA melting point but below its order-disorder transition temperature, and then quenched in liquid nitrogen. The measurements of PS-PLLA thermal behavior were carrier out by differential scanning calorimetry (DSC). The order-disorder transition temperature of PS-PLLA was above degradation temperature (~170° C.) as identified by small-angle X-ray scattering (SAXS). Amorphous PS-PLLA was obtained after the thermal treatments as evidenced by differential scanning calorimetry (DSC) and wide-angel X-ray measurements (WAXD).

After quenching from the microphase-separated melt, the thermally treated samples were then sectioned by ultramicrotome after $RuO_4$ staining. A variety of microstructures such as micelle, hexagonal cylinder, lamellae textures was identified by TEM and SAXS when $f_{PLLA}^v$=0.17, 0.30, and 0.56, respectively. These micelle, hexagonal cylinder, and lamellae microstructures are shown in FIGS. 1D through 1F, respectively.

Figure 2B:
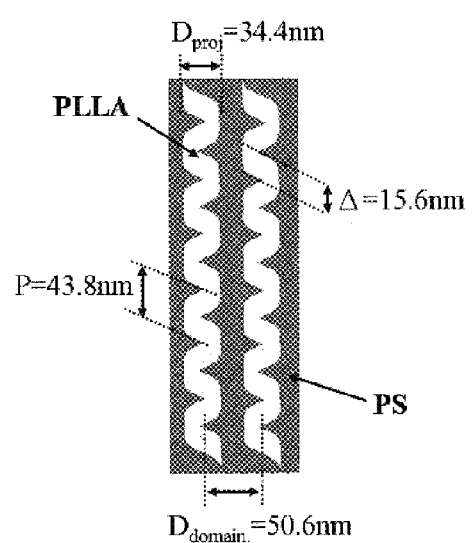
FIG. 2B is a schematic drawing illustrating the nanoscale helical microstructgure of PS29-PLLA22 ($f_{PLLA}^v=0.37$)

FIG. 2A is a TEM micrograph of PS29-PLLA22 ($f_{PLLA}^v$=0.37); and FIG. 2B is a schematic drawing illustrating the nanoscale helical microstructgure of PS29-PLLA22 ($f_{PLLA}^v$=0.37).

It was unexpected that a helical microstructure was observed when $f_{PLLA}$=0.37 as shown in the TEM micrographs provided in FIGS. 2A and 2B. The pitch and the diameter of the nanoscale helices were determined as 43.8 nm and 34.4 nm in average, respectively. The ratio of pitch to radius of the nanoscale helices (P/r=2.5) follows the general rule of helical formation in Nature of which the P/r value must be below 6.28.

Figure 3B:
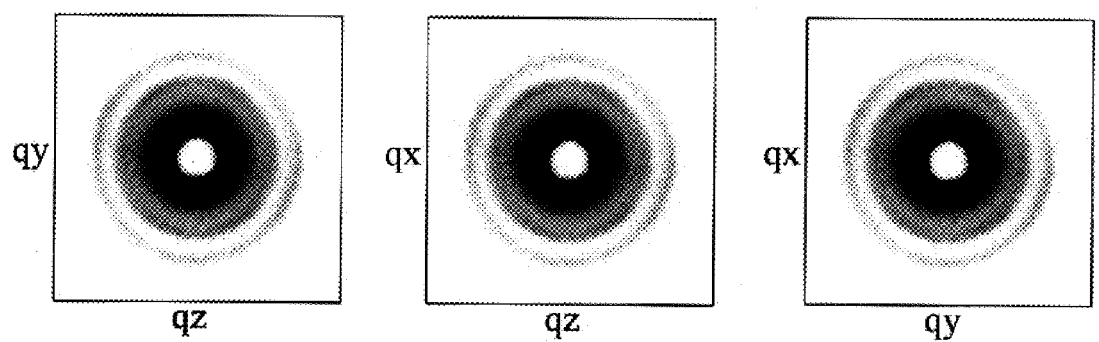
FIG. 3B shows two-dimensional SAXS diffraction patterns of the PS29-PLLA22 ($f_{PLLA}^v=0.37$) cast sample along various directions.

FIG. 3A is a three-dimensional TEM micrograph of a PS29-PLLA22 ($f_{PLLA}^v$=0.37) solution-cast sample sectioned along xyz planes; as shown, the xy planes are the basal plane of the cast substrate and the yz and zx planes are vertical planes with respect to the cast surface. And FIG. 3B shows two-dimensional SAXS diffraction patterns of the PS29-PLLA22 ($f_{PLLA}^v$=0.37) cast sample along various directions. As shown in FIGS. 3A and 3B, well-oriented microdomains consisting of hexagonally packed PLLA twists in PS matrix were observed for cast samples by using TEM. The occupied volume fraction of PLLA blocks was calculated as 40 vol %, this is approximately consistent with estimated value from synthetic results ($f_{PLLA}^v$=0.37).

Figure 4:
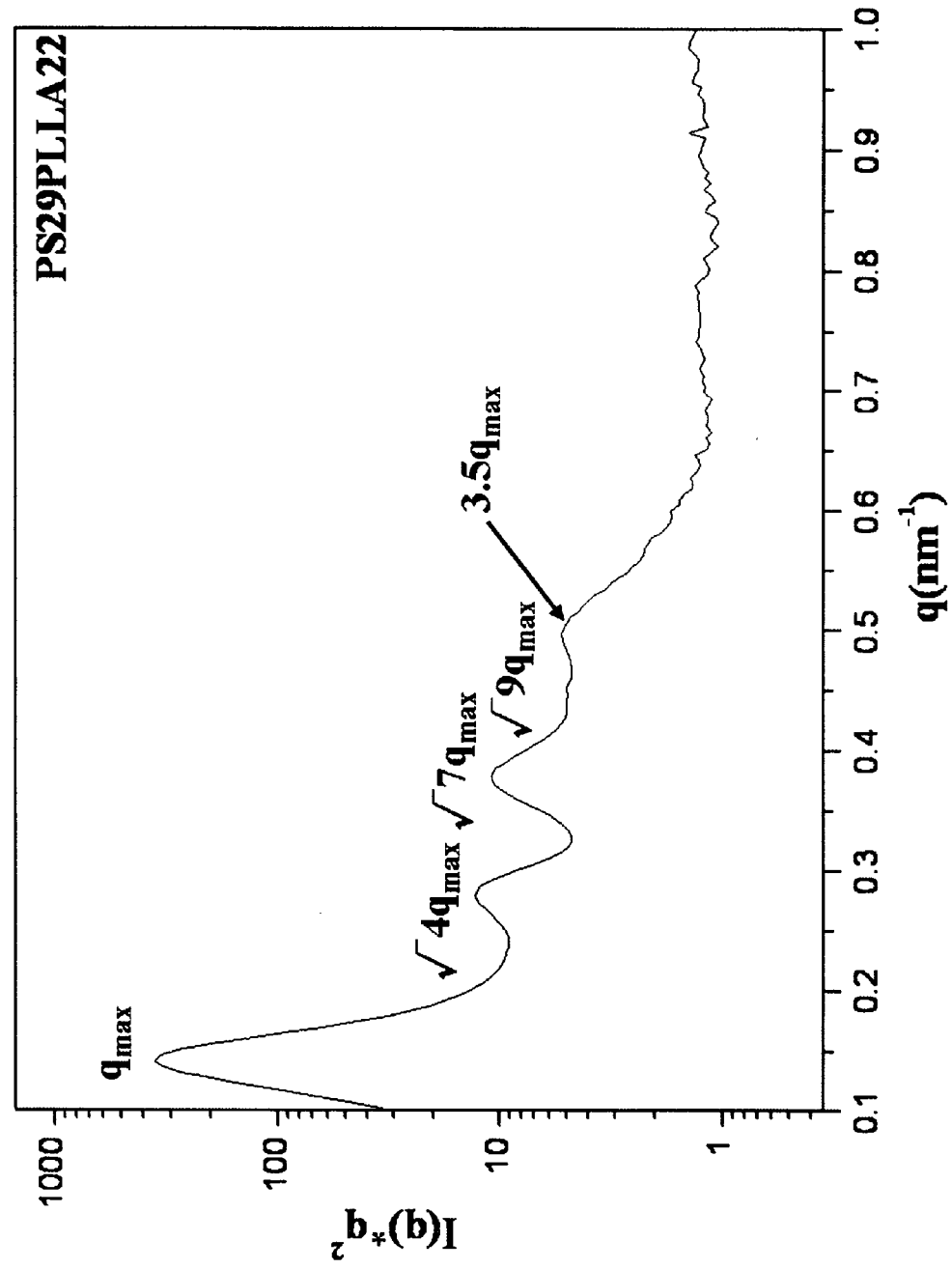
FIG. 4 is a plot showing the azimuthal integrated one-dimensional SAXS profile of the PS29-PLLA22 ($f_{PLLA}^v=0.37$) solution-cast sample.

Corresponding SAXS experiments were performed to further identify the observed morphology. Well-defined scattering pattern having six-fold symmetry is evident in the two-dimensional (2D) SAXS results along the helical axis whereas two-fold symmetry is obtained along the axis normal of helices. Azimuthal integrated one-dimensional SAXS profile was further obtained from the six-fold symmetry pattern as shown in FIG. 4, which is a plot showing the azimuthal integrated one-dimensional SAXS profile of the PS29-PLLA22 ($f_{PLLA}^v$=0.37) solution-cast sample. The diffraction peaks occur at relative q* values of 1:4½: 4½: 7½: 9½ and a broad diffraction peak appears at ca. 3.5 q*. These results are consistent with the hexagonally packed microstructures of which the nanoscale helices can be treated as cylindrical columns for packing due to the specific P/r value.

As discussed above, based on the assumption of cylindrical packing, the 3.5 q* diffraction can be identified as the form factor contribution of cylinder-like morphology in accordance with projected diameter along the helical axis observed by TEM. Furthermore, the determined long period, 50.6 nm, by SAXS is consistent with observed spacing by TEM. As a result, the 3D geometrical arrangement of nanoscale helical microstructure in bulk for the self-assembly of PS-PLLA was clearly identified. Also, the helical morphology adopts a left-handed helical sense equal to that of the constituted block as observed by TEM. By contrast, the formation of nanoscale helical microstructures has not been found in PS-PLLA block copolymers and PLLA homopolymer. Consequently, the appearance of the helical microstructure for PS-PLLA is attributed to the effect of chirality interacting with the immiscibility of constituted blocks and the entropy of mixing.

The analyses of block copolymer thermodynamics are complicated by the chiral entities of constituted components. This will definitely be an impact to the conventional treatments of block copolymers in theory. The helical behavior is expected by the chiral sense of block copolymers.

Figure 5A:
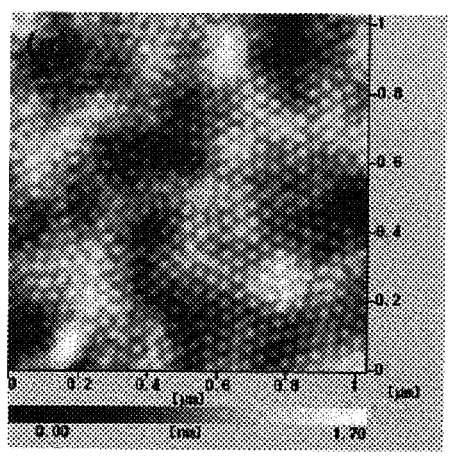
FIG. 5A is an SPM micrograph of the PS29-PLLA22 ($f_{PLLA}^v=0.37$) solution-cast sample before hydrolysis.
Figure 5B:
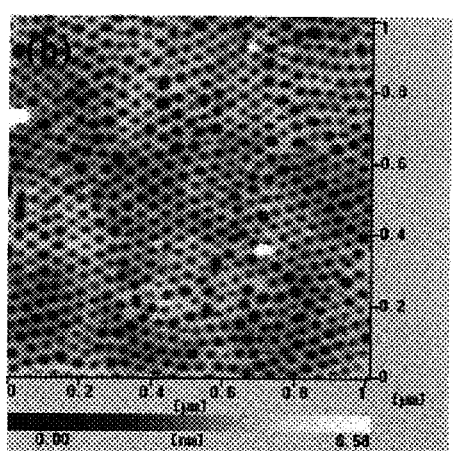
FIG. 5B is an SPM micrograph of the PS29-PLLA22 ($f_{PLLA}^v=0.37$) solution-cast sample after hydrolysis.

FIG. 5A is an SPM (Scanning probe microscopy) micrograph of the PS29-PLLA22 ($f_{PLLA}^v$=0.37) solution-cast sample before hydrolysis. And FIG. 5B is an SPM micrograph of the PS29-PLLA22 ($f_{PLLA}^v$=0.37) solution-cast sample after hydrolysis. The hexagonally packed helices were treated by subjecting the PLLA to hydrolysis. As observed by AFM, hexagonally packed nanohole arrays were generated on the surface of solution-casting PS-PLLA samples after hydrolysis.

Figure 6A:
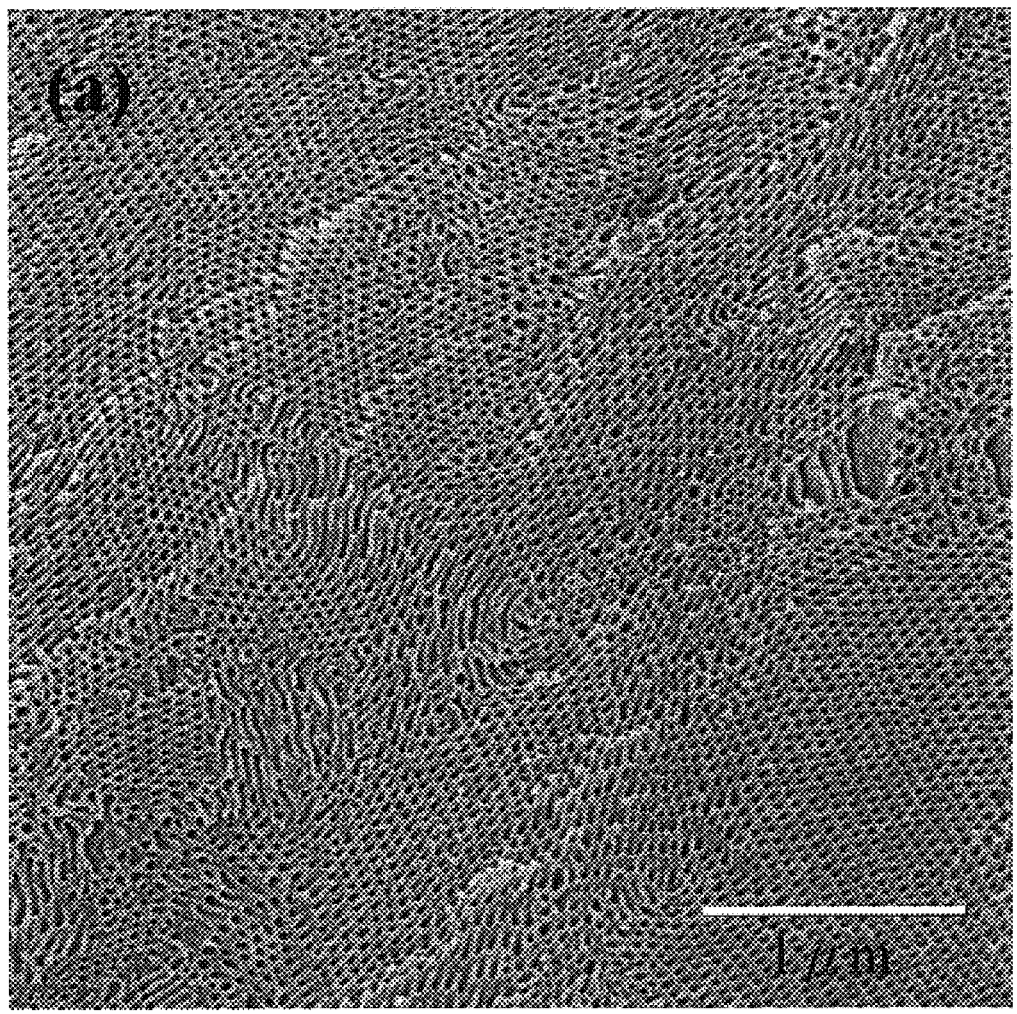
FIG. 6A is an FESEM micrograph of a hydrolyzed PS29-PLLA22 ($f_{PLLA}^v=0.37$) sample viewed parallel to the helical axes.
Figure 6B:
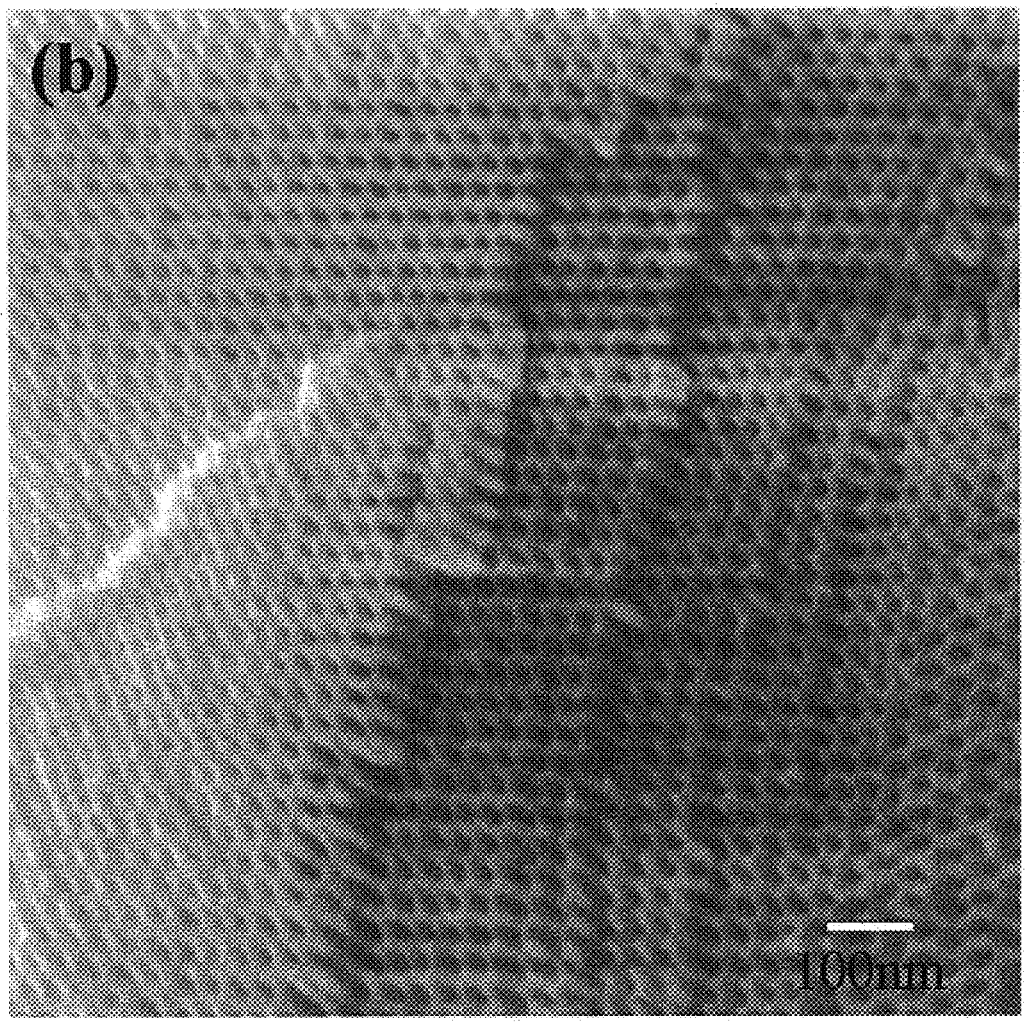
FIG. 6B is an FESEM micrograph of a hydrolyzed PS29-PLLA22 ($f_{PLLA}^v=0.37$) sample viewed perpendicular to the helical axes.

FIG. 6A is an FESEM micrograph of a hydrolyzed PS29-PLLA22 ($f_{PLLA}^v$=0.37) sample viewed parallel to the helical axes. And FIG. 6B is an FESEM micrograph of a hydrolyzed PS29-PLLA22 ($f_{PLLA}^v$=0.37) sample viewed perpendicular to the helical axes. To further identify the texture of the hydrolyzed PS-PLLA samples, field emission scanning electron microscopy was used to observe the samples from different views. To view parallel to the helical axes, ordered nanohole arrays were observed by FESEM and the results are similar to the observations by SPM. To view perpendicular to the helical axes, traces of degradation for PLLA helical morphology can be identified. As a result, helical channels can be obtained by simple hydrolyzing the PLLA helices.

Example 7

Flowchart Diagram

Figure 7:
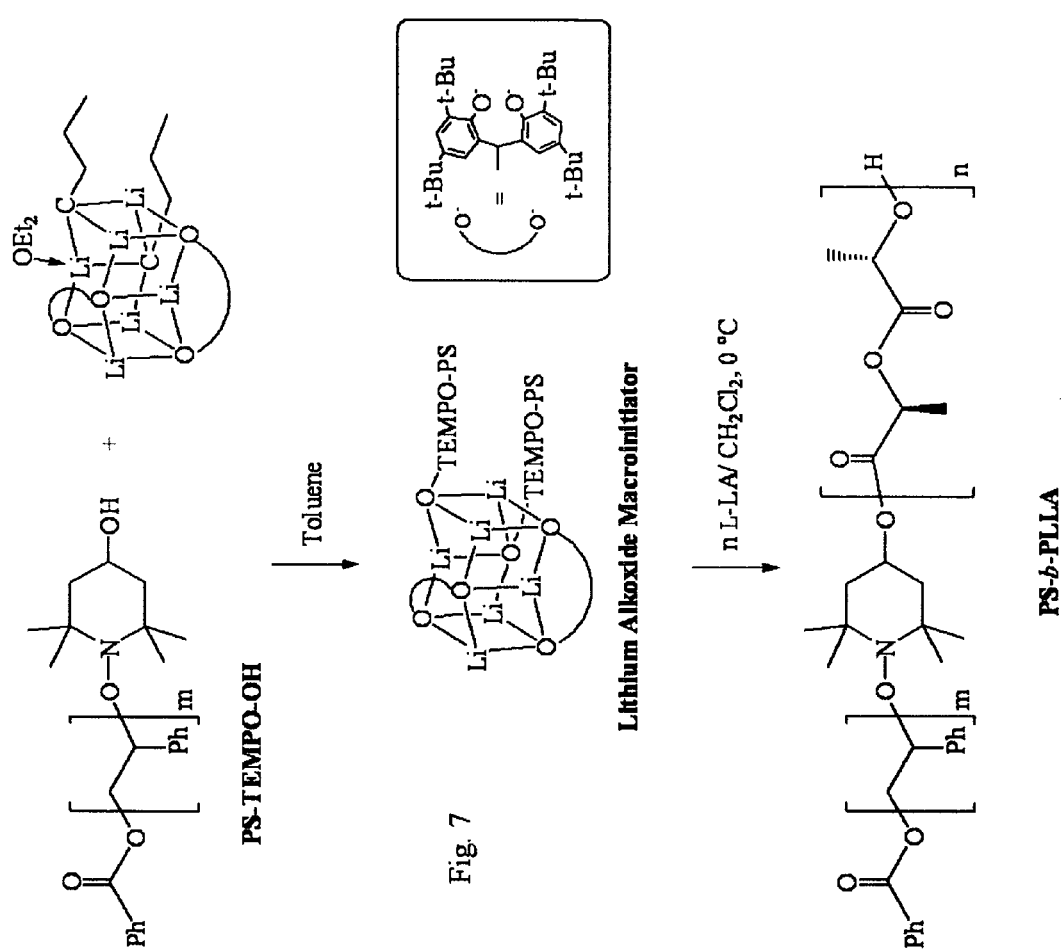
FIG. 7 is a flowchart diagram showing the process of synthesizing the poly(styrene)-poly(L-lactide) (PS-PLLA) chiral block copolymers of the present invention.

FIG. 7 is a flowchart diagram showing the process of synthesizing the poly(styrene)-poly(L-lactide) (PS-PLLA) chiral block copolymers of the present invention. Those steps described in the flowchart diagram of FIG. 7 have been discussed in Example 2.

Example 8

Synthesis of Block Copolymers of PS280PLLA127

Another series of PS-PLLA copolymers with different volume ratios were prepared by the same two-step "living" polymerization sequence. On the basis of molecular weight and volume ratio, these PS-PLLAs were designated as PSx-PLLAy ($f_{PLLA}^v$=z), with x and y representing the numbers of the repeating unit for PS and PLLA blocks and z representing the volume fraction of PLLA (calculated by assuming that densities of PS and PLLA were 1.02 and 1.18 g/cm³, respectively). Bulk samples of the block copolymers were prepared by solution casting from dichloromethane ($CH_2Cl_2$) solution (10 wt % of PS-PLLA) at room temperature. After quenching from the microphase-separated melt, 10 the thermally treated PS-PLLA samples were subsequently sectioned by ultramicrotome. A variety of self-assembling nanostructures, including spherical, hexagonally packed cylindrical, and lamellar structures, were identified by transmission electron microscopy (TEM) and small-angle X-ray scattering (SAXS). Similar to the achiral block copolymer, poly(styrene)-b-poly(D,L-lactide) (PS-PLA), 11 most of the PS-PLLA samples exhibited typical phase structures as predicted by the theory based on block copolymer thermodynamics.

Figure 8B:
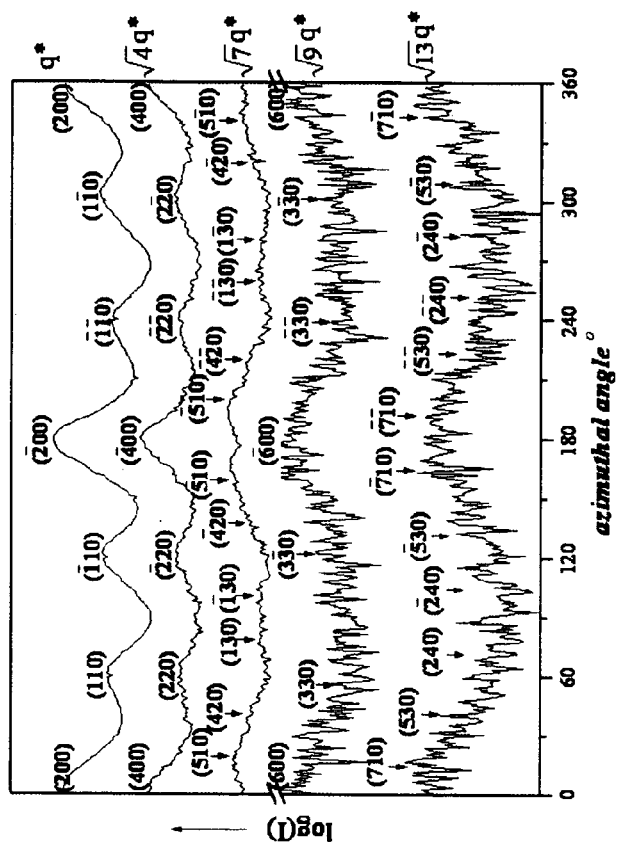
FIG. 8B shows the reflections in the 2D SAXS diffraction pattern of PS280-PLLA127 ($f_{PLLA}^v=0.35$) sample along the direction of helical axes indicate that the reflections possess almost identical spacing; the intensity of these reflections exhibits a 2-fold symmetry.
Figure 8A:
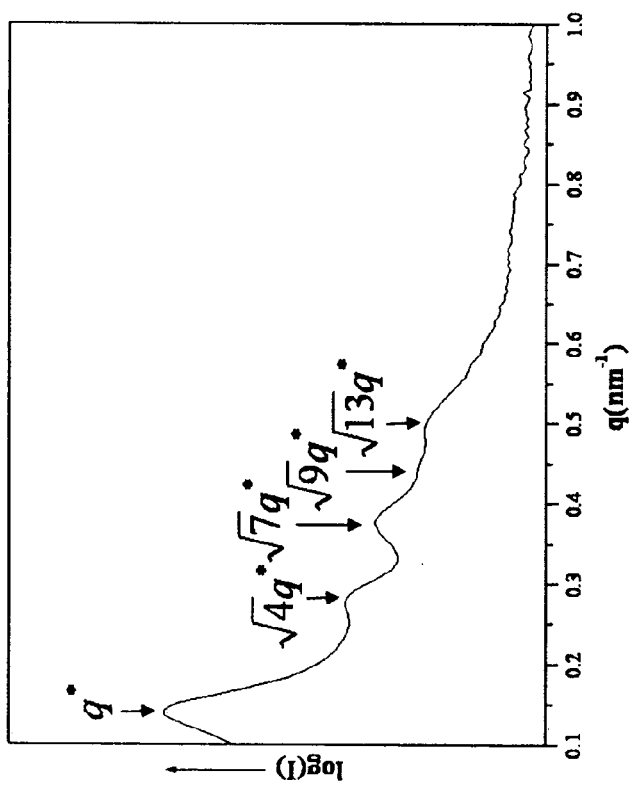
FIG. 8A shows one-dimensional SAXS profiles of PS280-PLLA127 ($f_{PLLA}^v=0.35$) sample extracted from 2D patterns by azimuthal integration; diffraction peaks were found to occur at q* ratios of $1:4½: 7½: 9½: 13½$.

A nanohelical phase structure was observed for the PS280PLLA127 ($f_{PLLA}^v$=0.35) sample, similar to those shown FIGS. 2A and 2B. The pitch, projected diameter, and diameter of the nanohelices were determined, on average, as 43.8, 31.9, and 25.3 nm, respectively. Upon appropriate control of solvent evaporation rate, well-oriented microdomains consisting of 3D packed PLLA nanohelices in PS matrix were observed. By examining the phase structure at different tilting angles in TEM, the nanohelices were found to be packed in a hexagonal lattice. The occupied volume fraction of PLLA blocks was calculated to be 31 vol %, which is approximately consistent with the estimated value from synthetic results ($f_{PLLA}^v$=0.35). Corresponding 2D SAXS experiments using synchrotron radiations were performed to further identify the observed morphology. A well-defined scattering pattern having hexagonal-like diffraction was seen when the X-ray beam was aligned along the helical axis. One-dimensional SAXS profiles were extracted from 2D patterns by azimuthal integration as shown in FIG. 8A. The diffraction peaks were found to occur at q* ratios of 1:4½: 7½: 9½: 13½. These results are consistent with the hexagonally packed phase structure of which the nanohelices can be treated as cylinder-like packing. However, even the reflections in the 2D SAXS diffraction pattern along the direction of helical axes indicate that the reflections possess almost identical spacing; the intensity of these reflections exhibits a 2-fold symmetry as shown in FIG. 8B. Consequently, these results suggest a pseudo-orthorhombic structure for the packing of nanohelices (because the ratio of the a-axis and b-axis unit cell dimensions is nearly equal to) instead of a true hexagonal (it is probably orthorhombic). We speculate that the 2-fold symmetry in the intensity for an almost hexagonally packed structure is attributed to the deformation of nanohelix in uniaxial direction, in a way similar to the α-helical conformation of poly(L-alanine) and the α-form crystal of PLLA. In the TEM micrograph, it was found that the nanohelix adopted a left-handed helical sense, which is consistent with the fact that the PLLA blocks also possess an L chiral center. As discussed heretofore, the formation of nanohelical phase structure has never been reported in PS-PLA block copolymers and PLLA homopolymers before. We believe that the appearance of the nanohelical structure in the PS-PLLA may be attributed to the effect of chirality interacting with the immiscibility of constituted blocks, unlike noncentrosymmetric phase structures in achiral triblock copolymers or their blends. Instead of the interplay in the elastic potential and interfacial energy, the self-assembly of helical curvature is induced by the formation of specific configurations of PLLA chains due to the interactions of chiral entities. Similar to the formation of helical crystals from chiral liquid crystalline polymers, the chirality strength is strong enough to compete with self-ordering processes and to stabilize the helical morphology when the phase structures possess the specific configurations (for instance, low liquid crystalline order). The studies of detailed mechanisms are still in process.

Example 9

Synthesis of Block Copolymers of Poly(4-vinylpyridine)-poly(L-lactide), PS280PLLA127

Figure 9:
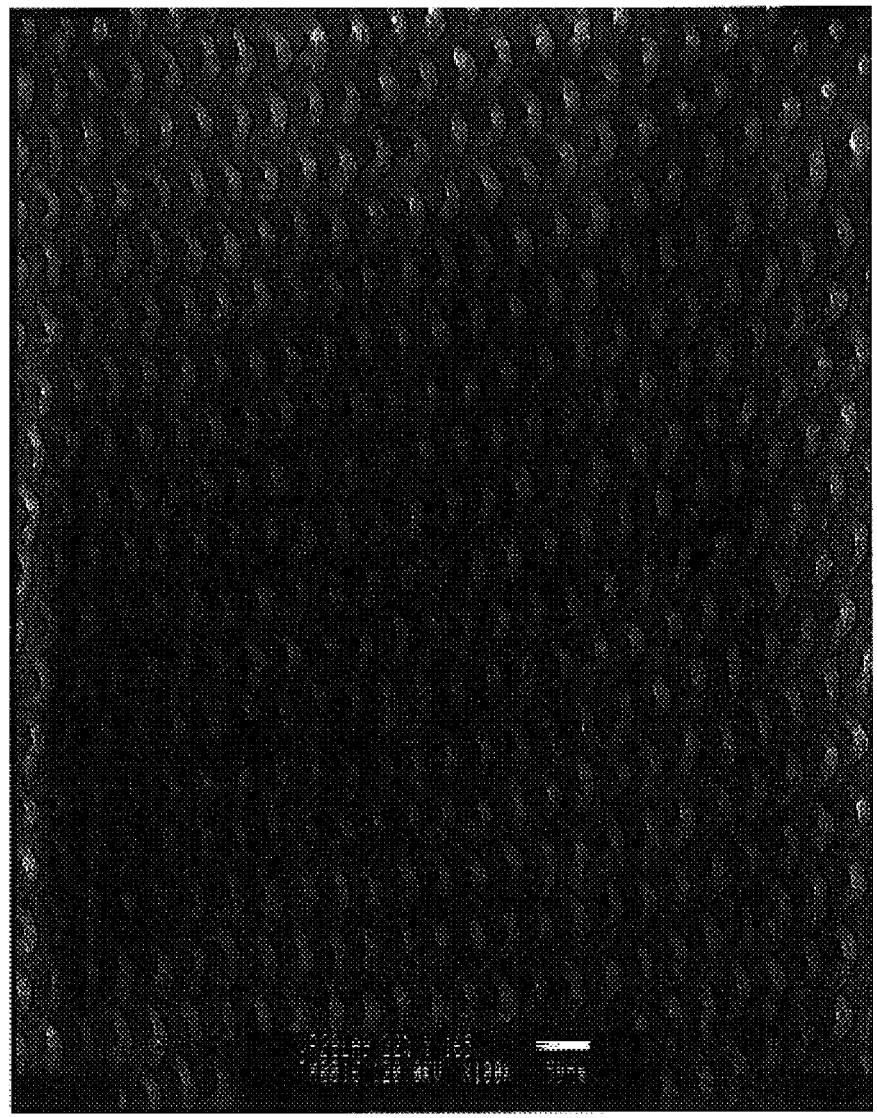
FIG. 9 is a TEM micrograph of block copolymers of Poly(4-vinylpyridine)-poly(L-lactide) ($f_{PLLA}^v=0.37$), showing a helical microstructure.

Block copolymers of Poly(4-vinylpyridine)-poly(L-lactide) were synthesized using a process similar to those discussed in previous examples. The volume fraction poly (L-lactide) was calculated to be about 23% ($f_{PLLA}^v$=0.23). As shown in the TEM micrograph in FIG. 9, a helical microstructure was observed.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for making a series of nanoscale microstructures comprising the steps of:
    (1) forming a chiral block copolymer containing a first polymer block of a first polymer and a second polymer block of a second polymer, wherein at least said first polymer is a chiral polymer exhibiting chirality, and said first and second polymer blocks are capable of being subject to a micro-phase separation and said first polymer has a volume fraction ranging from 10 to 90%;
    (2) causing a microphase separation in said chiral block copolymer;
wherein said first polymer is poly(L-lactide) and said second polymer is selected from the group consisting of polystyrene and pol(4-vinylpyridine), further wherein said chiral block copolymer is poly(styrene)-poly(L-lactide) (PS-PLLA) chiral block copolymer when said second polymer is polystyrene and poly(4-vinylpyridine)-poly(L-lactide) (P4-VP-PLLA) chiral block copolymer when said second polymer is pol(4-vinylpyridine);
further wherein said poly(styrene)-poly(L-lactide) (PS-PLLA) chiral block copolymer is prepared using a polymerization process comprising the following steps:
    (a) mixing styrene with BPO and 4-OH-TEMPO to form 4-hydroxy-TEMPO-terminated polystyrene; and
    (b) mixing said 4-hydroxy-TEMPO-terminated polystyrene with L-lactide in an organic solvent to form said poly(styrene)-poly(L-lactide) chiral block copolymer.

2. The method for making a series of nanoscale microstructures according to claim 1, wherein said chiral block copolymer is poly(styrene)-poly(L-lactide) (PS-PLLA) chiral block copolymer, said first polymer is poly(L-lactide), and said second polymer is polystyrene.

3. The method for making a series of nanoscale microstructures according to claim 1, wherein said chiral block copolymer is poly(4-vinylpyridine)-poly(L-lactide) (P4VP-PLLA) chiral block copolymer, said first polymer is poly(L-lactide), and said second polymer is pol(4-vinylpyridine).

4. The method for making a series of nanoscale microstructures according to claim 1, wherein said first polymer has a volume fraction ranging from about 20% to about 49%.

5. The method for making a series of nanoscale microstructures according to claim 1, wherein said nanoscale microstructures are a series of helical microstructures.

6. The method for making a series of nanoscale microstructures according to claim 1, wherein said nanoscale microstructures are a series of cylindrical microstructures each with a hexagonal crossection.

7. The method for making a series of nanoscale microstructures according to claim 1, wherein said polymerization process is a living polymerization in which monomers are sequentially added to a polymerization mixture.

8. The method for making a series of nanoscale microstructures according to claim 1, wherein said phase separation of said chiral block copolymer is achieved through crystallization.

9. A process for making an article of manufacture containing a series of repeating nanoscale microstructures formed in a substrate which is formed using a process comprising the steps of:
  (1) forming a chiral block copolymer containing a first polymer block of a first polymer and a second polymer block of a second polymer, wherein at least said first polymer is a chiral polymer exhibiting chirality, and said first and second polymer blocks are capable of being subject to a micro-phase separation and said first polymer has a volume fraction ranging from 10 to 90%;
  (2) causing a microphase separation in said chiral block copolymer;
wherein said first polymer is poly(L-lactide) and said second polymer is selected from the group consisting of polystyrene and pol(4-vinylpyridine), further wherein said chiral block copolymer is poly(styrene)-poly(L-lactide) (PS-PLLA) chiral block copolymer when said second polymer is polystyrene and poly(4-vinylpyridine)-poly(L-lactide) (P4-VP-PLLA) chiral block copolymer when said second polymer is pol(4-vinylpyridine); further wherein said poly(styrene)-poly(L-lactide) (PS-PLLA) chiral block copolymer is prepared using a polymerization process comprising the following steps:
  (a) mixing styrene with BPO and 4-OH-TEMPO to form 4-hydroxy-TEMPO-terminated polystyrene; and
  (b) mixing said 4-hydroxy-TEMPO-terminated polystyrene with L-lactide in an organic solvent to form said poly(styrene)-poly(L-lactide) chiral block copolymer.

10. The process according to claim 9, wherein said block copolymer is a poly(styrene)-poly(L-lactide) chiral block copolymer, and said first polymer is poly(L-lactide) and said second polymer is polystyrene.

11. The process according to claim 9 wherein said block copolymer is a poly(4-vinylpyridine)-poly(L-lactide) chiral block copolymer, and said first polymer is poly(L-lactide) and said second polymer is poly(4-vinylpyridine).

12. The process according to claim 9 wherein said first polymer has a volume fraction ranging from about 20% to about 49%.

13. The process according to claim 9 wherein said nanoscale microstructures are a series of helical microstructures.

14. The process according to claim 9 wherein said nanoscale microstructures are a series of cylindrical microstructures each with a hexagonal crossection.

15. The process according to claim 9 wherein said polymerization process is a living polymerization in which monomers are sequentially added to a polymerization mixture.

16. The process according to claim 9 wherein said phase separation of said chiral block copolymer is achieved through crystallization.

* * * * *